United States Patent [19]

Gundry

[11] 4,263,624

[45] Apr. 21, 1981

[54] ANALOG RECORDING ON MAGNETIC MEDIA

[75] Inventor: Kenneth J. Gundry, San Francisco, Calif.

[73] Assignee: Dolby Laboratories Licensing Corporation, San Francisco, Calif.

[21] Appl. No.: 57,473

[22] Filed: Jul. 13, 1979

Related U.S. Application Data

[63] Continuation-in-part of Ser. No. 968,684, Dec. 12, 1978, which is a continuation-in-part of Ser. No. 864,541, Dec. 27, 1977, abandoned.

[51] Int. Cl.³ .......................... G11B 5/02; G11B 5/45; G11B 5/47
[52] U.S. Cl. ........................................ 360/25; 360/31; 360/65; 360/66; 360/27
[58] Field of Search ...................... 360/25, 31, 65, 67, 360/66, 8, 27

[56] References Cited

U.S. PATENT DOCUMENTS

| 2,628,287 | 2/1953 | Haynes | 360/66 |
| 2,791,640 | 5/1957 | Wolte | 360/25 |
| 3,300,590 | 1/1967 | Cronin | 360/68 |
| 3,757,254 | 9/1973 | Takahashi et al. | 360/65 |
| 3,798,673 | 3/1974 | Koinuma | 360/66 |
| 3,873,992 | 3/1975 | Sato | 360/65 |
| 4,011,585 | 3/1977 | Sunaga | 360/65 |

Primary Examiner—Vincent P. Canney
Attorney, Agent, or Firm—Limbach, Limbach & Sutton

[57] ABSTRACT

A system for recording analog information on a magnetic medium in which the record bias is dynamically varied in response to the amplitude in a predetermined frequency spectrum of the information to be recorded. The record amplifier gain and equalization may be simultaneously dynamically varied as the record bias in order to maintain a record/playback response relatively invariant with respect to changes in the bias level.

28 Claims, 18 Drawing Figures

ANALOG RECORDING ON MAGNETIC MEDIA

This application is a continuation-in-part of my copending application Ser. No. 968,684, filed Dec. 12, 1978, which, in turn, is a continuation-in-part of Ser. No. 864,541, filed Dec. 27, 1977, now abandoned.

BACKGROUND OF THE INVENTION

The present invention relates to recording on magnetic media and more particularly to a system for varying the recording bias dynamically so that at each instant the bias is more nearly optimized for the spectrum of material to be recorded than when a fixed bias is employed. In the magnetic recording of analog signals, for example audio, it is normal to employ high frequency recording bias to linearize the otherwise highly nonlinear medium. The current applied to the recording head then consists of the addition of a current representing the analog signal to be recorded and a bias current waveform, normally sinusoidal, at a frequency several times higher than the highest frequency component of the analog signal. The magnitude of the bias current affects various parameters of the recording system: signal-to-noise ratio, harmonic distortion, frequency response, sensitivity, output level, modulation noise and the incidence of drop-out (momentary drops in output level due to inconsistencies in the magnetic tape and in its contact with the recording head). For many typical recording situations, particularly those where the recording medium is a Compact Cassette, the primary concern is a conflicting requirement between a magnitude of bias current that results in minimum distortion at low and middle audio frequencies along with minimum drop-outs and a lower bias current magnitude that provides a higher maximum output level at high audio frequencies. Heretofore, bias level has been chosen as a compromise among the various tape parameters that vary with the bias level. In the case of Compact Cassette recording, tape saturation occurs at high audio frequencies, thus limiting the high frequency maximum output level and causing an audible loss in the high frequency range of reproduced tapes. High frequency tape saturation in Compact Cassette recording can be substantially reduced, although apparently not completely eliminated by optimizing record bias for that result. Although saturation does not generally occur at high frequencies in reel-to-reel tape recorders operated at professional speeds, for example, 38 cm/sec (15 ips) or 19 cm (7½ ips), the high frequency output level and other record parameters of such recorders are enhanced by bias current levels lower than compromise values generally used. However, the low and middle frequency distortion, drop-out rate and other parameters are degraded by such lower bias magnitude.

Since the conflicting requirement between a bias level chosen for optimum low and mid-frequency audio versus a bias level chosen for optimum high frequency audio output level is basic to typical recording situations and because the results of that selection are so readily audible in the reproduced recording, the emphasis of the application and the preferred embodiments are directed to the resolution of the conflict. Those of ordinary skill in the art will appreciate that circumstances, particularly the type of magnetic medium, effective recording speed or specially desired results may cause other record parameters to be of greater importance.

While the selection of a preferred bias level at any given frequency still requires a compromise, because the parameters tend to be optimum at different bias levels even for a given frequency, a substantial improvement in overall performance can nevertheless result compared to a compromise bias level for the entire frequency spectrum of interest to be recorded. The choice of bias level therefore requires information on the frequency spectrum to be recorded.

It should be noted that for each value of bias current the recording amplifier gain and equalization can be set to give the desired level of recorded magnetic flux and the desired overall (record-playback) frequency response, provided of course that the input level is not so high as to result in tape non-linearity.

SUMMARY OF THE INVENTION

In accordance with the teachings of the present invention these and other problems in the prior art are overcome by a system for recording on a magnetic medium in which the recording bias is dynamically varied to more nearly optimize the bias for the spectrum of the material to be recorded. To maintain a desired overall record-playback frequency response, the recording amplifier characteristics can be dynamically varied as the bias is varied.

More particularly, a quiescent bias level is provided that is substantially optimized for one frequency spectrum of the information to be recorded. The amplitude of the information to be recorded in a further frequency spectrum is monitored and when that amplitude exceeds a predetermined value the bias level is varied from its quiescent level to more nearly optimize the bias level for the further frequency spectrum. Additionally, the record amplifier gain and equalization can be simultaneously varied with the bias in order to maintain a more invarying record/playback response.

According to a preferred embodiment, the invention is employed in an audio tape recording system in which the quiescent bias level is chosen to provide substantially the best results at low and mid-audio frequencies. Because the quiescent level is no longer a compromise fixed level, it may be at a higher level, thus enhancing the recorded quality of the low and mid-audio frequency material. The high frequency level of the signal to be recorded is monitored and when it exceeds a predetermined magnitude, the bias is reduced from its quiescent value. In systems in which the tape tends to saturate at high frequencies, the dynamic bias reduction also reduces high frequency modulation noise in addition to enhancing the high frequency maximum output level. Since the bias change affects frequency response, the record amplifier gain and equalization are appropriately altered as the bias is reduced. An overall improvement in the information recorded on the tape is thereby achieved.

These and other advantages of the present invention will be better appreciated as the following detailed description is read in conjunction with the drawings.

DETAILED DESCRIPTION OF THE INVENTION

Figure 1:
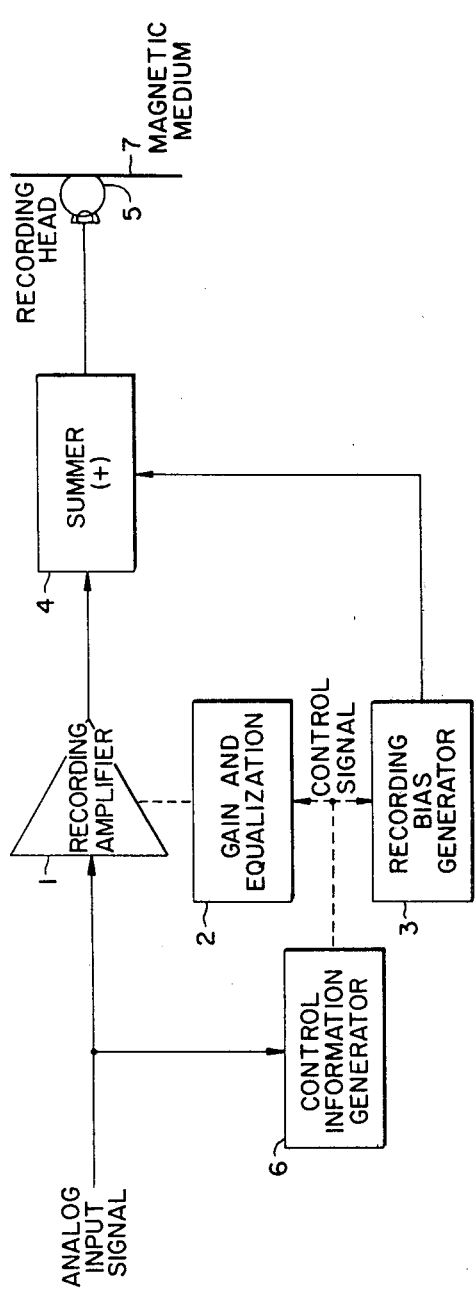
FIG. 1 is a block diagram showing an analog recording system embodying the invention.

Referring now to the drawings and particularly to FIG. 1 which shows a basic block diagram of the invention in the context of an analog recording system for recording signals in the audio spectrum on a magnetic medium. As in a conventional recorder, the input signal passes via a recording amplifier 1 having an amplification and frequency response determined by gain and equalization components represented by block 2 to a summing means 4 and thence to the recording head 5 in a recording relation with magnetic medium 7, which is magnetic tape in this example. A high frequency (roughly an order of magnitude higher than the highest frequency to be recorded, typically about 100 kHz for audio recorders) oscillator 3 generates the recording bias waveform which is also fed to the recording head 5 via summer 4. However, in the present invention the recording equalization and gain, determined by block 2, and the amplitude of the recording bias generated by block 3 can be varied by means of a control signal produced by block 6. The value of this control signal is determined by the spectrum and amplitude of the analog input signal in such a way that as the high frequency content of the input increases above a predetermined threshold, the control signal operates to reduce the recording bias level generated by block 3 from its quiescent value, thereby permitting the recording of high levels of high frequencies on the tape, and also to alter the gain and equalization set by block 2 so as to maintain an overall flat record-playback frequency response and a constant recording sensitivity. The control signal generator 6 may alternatively be fed from the output of the recording amplifier 1 rather than from its input.

Figure 2:
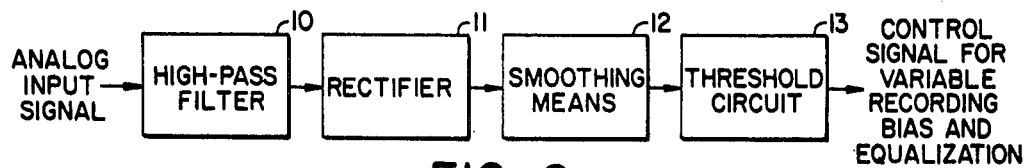
FIG. 2 is a block diagram showing the control signal generator of FIG. 1 in greater detail.

Further details of the control signal generator 6 are shown in FIG. 2. The signal to be recorded is fed via a high-pass filter 10 whose characteristic is derived from the high frequency overload characteristics of the tape, to a rectifier 11. The resultant unidirectional signal is smoothed in block 12 and passes to a threshold circuit 13 which only gives an output when its input exceeds some value corresponding to an original high frequency input signal which would overload the tape with the recording bias at its quiescent value. As described above, the output of block 13, the control signal, results in a reduced recording bias and therefore prevents or reduces the overload, at the same time altering the recording parameters to prevent changes in overall frequency response and sensitivity.

Figure 3:
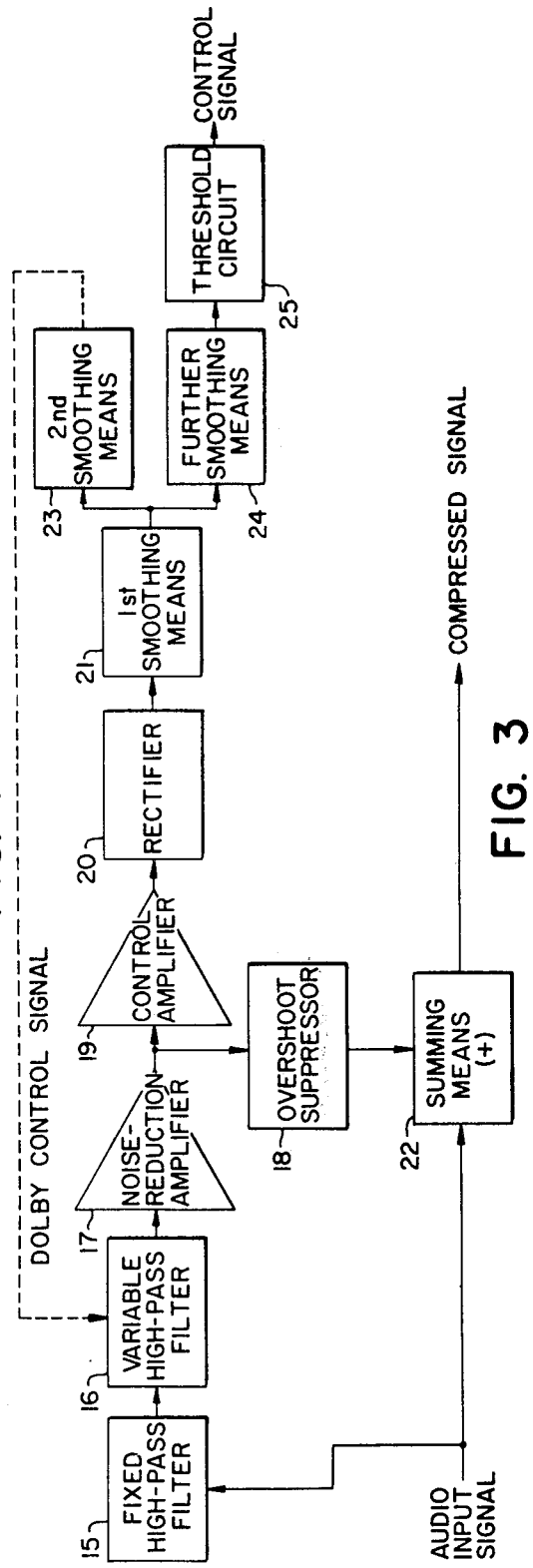
FIG. 3 is a block diagram showing an alternate control signal generator.

Low-speed audio tape recorders, using Compact Cassettes, for example, frequently employ a type of noise reduction system designated commercially as the Dolby B-Type noise reduction system, whose compressor, employed during recording, contains a high-pass filter, rectifier and smoothing means similar to those of FIG. 2. It is therefore possible to derive the control signal for the variable recording bias gain and equalization from the Dolby B-Type compressor as indicated in FIG. 3. Blocks 15 to 23 inclusive constitute a normal Dolby B-Type compressor. By comparing FIGS. 2 and 3 it will be seen that blocks 15 to 17 and 19 to 21 carry out similar operation to blocks 10 to 12, and that, therefore, a control signal to operate on the recording and equalization can be generated by the addition of a threshold-determining circuit 25 corresponding to block 13 of FIG. 2, and optionally, a further smoothing means 24. The threshold-determining circuit 25 may alternatively be fed from the output of the second smoothing means 23, when the further smoothing means 25 is omitted.

Various control signal circuit configurations will be apparent to those of ordinary skill in the art depending in part on the level of sophistication desired and permissible cost. In any case, the generation of a control signal is merely an intermediate step in causing the record bias and, usually, the record gain and equalization to vary in a way that results in a recorded signal more faithful to the applied signal than if a fixed bias were employed. Some circuits may be less effective than others, for reasons of cost, for example, but will still result in improved recordings.

For optimum results the operation of varying the recording bias and other characteristics should be performed independently in each channel of a multi-track recorder, so as to prevent the modulation of the recording parameters of one channel by material being recorded on other tracks. In the application to stereo recording, where there is a considerable degree of correlation between the material to be recorded on the two tracks, it may sometimes be permissible to modify the recording parameters of both channels together in accordance with one control signal derived from some combination of the material in the two channels, for example the sum of the channels or the greater of the channels.

The ideal function relating the amplitude of the bias current to the level and spectrum of the signal to be recorded is complex, and will be different for every type and brand of recording tape. In tape media in which there is a value of recording bias which permits linear recording of the highest levels and highest frequencies present in the actual material to be recorded, this value however being less than the quiescent value normally employed to improve other factors of the recording process, the bias-changing function should be such that the working point of the tape is adjusted to be always below saturation, that is such that the tape remains linear. It will then usually be necessary to introduce variable recording gain and equalization to maintain the frequency response and sensitivity as the bias amplitude changes. This state of affairs applies for example to recording at 38 and 19 cm/sec (15 and 7½ ips, respectively) using the NAB or CCIR recording equalization standards.

In tape media in which there is no value of recording bias permitting linear operation with high level high frequency signals, saturation is inevitable, and variable bias cannot eliminate non-linearity but can only reduce its extent. The bias-changing function should then be such as to minimize the degree of tape saturation up to as high an input level as feasible. In this case, the tape medium remains "imperfect", the imperfections being reduced somewhat, permitting a higher maximum output level at high frequencies and reducing modulation noise that occurs at and near saturation. This state of affairs applies to low-speed recording such as in the Compact Cassette system. In such systems variable equalization may be desirable to compensate for increased high frequency response as the bias is lowered.

The quiescent recording bias, and therefore the quiescent recording equalization and amplification, may not be those which would have been adopted in a recorder employing fixed bias, since the conventional compromises between high frequency saturation and other aspects of the recording performance no longer need apply. In general variable bias will permit a higher quiescent bias amplitude, leading to lower distortion at low and middle frequencies. This can allow an increase in maximum recording levels, and result in an improvement in signal-to-noise ratio.

Figure 4:
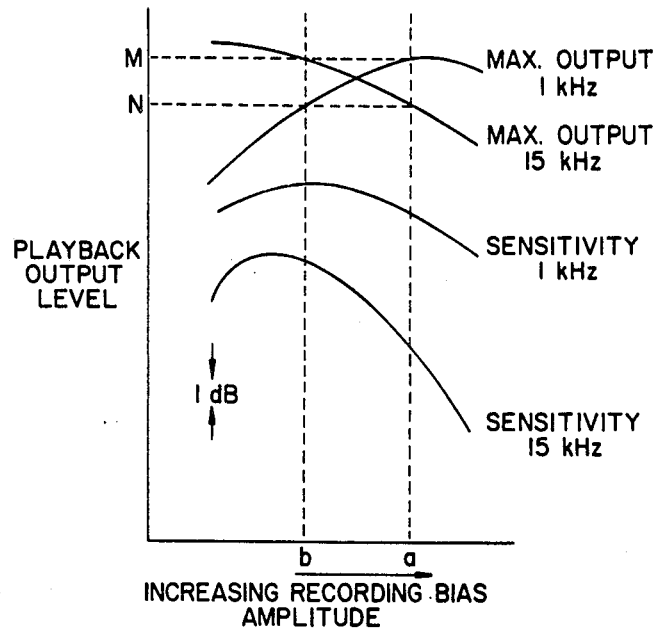
FIG. 4 is a set of examplary curves relating recording bias amplitude to playback output level for high speed audio recording.

FIG. 4 illustrates how the sensitivity and maximum undistorted output level of a recorder running at 38 cm/sec vary with recording bias amplitude for a typical magnetic tape used at such a speed in a system employing normal NAB or CCIR recording characteristics. Quiescent bias amplitude 'a' may be employed to permit the recording of high levels at low and middle frequencies. However, with this value of bias, the maximum output at 15 kHz (N) is less than that at lower frequencies (M) and on material containing very large amplitudes at high frequencies (bright material) distortion may occur. If the bias is reduced to, for example, amplitude 'b' during such passages, the high frequency maximum output level is increased and distortion is reduced or prevented. In reducing the bias from 'a' to 'b', the sensitivities at 1 kHz and 15 kHz increase by about 1 and 3 dB respectively, and as a result it is desirable to reduce the gain and high-frequency boost in the recording amplifier to maintain the overall sensitivity and frequency unchanged. The amount by which the bias should be reduced depends on how much the high frequency components of the material exceed the high frequency maximum output level curves. In such a high speed recorder, only under very stringent program conditions will bias reduction be necessary.

Figure 5:
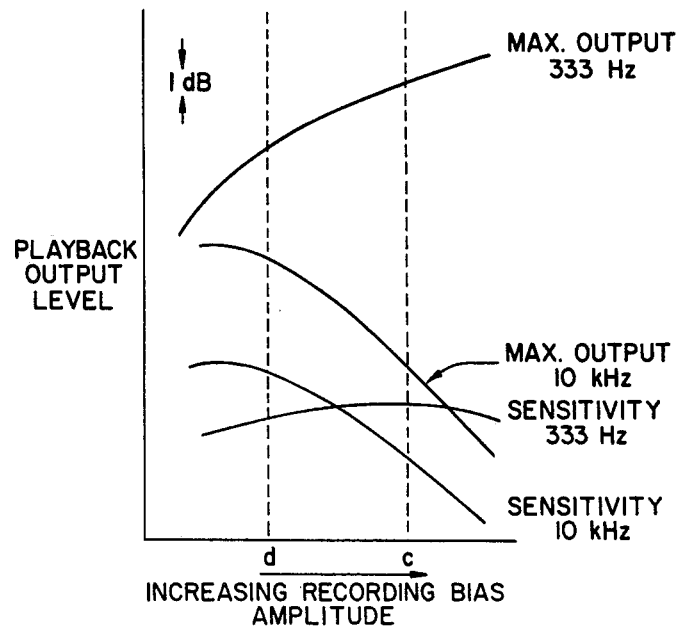
FIG. 5 is a set of exemplary curves relating recording bias amplitude to playback output level for low speed audio recording.

However, in low speed recording bias reduction is required far more frequently. FIG. 5 shows similar information to FIG. 4, but for 4.76 cm/sec (e.g. Compact Cassette). Conventionally the choice of a recording bias amplitude involves a compromise between maximum output level at low and middle frequencies and maximum output level at high frequencies. A typical compromise is amplitude 'c', with which the maximum output at 10 kHz is 10 dB less than at 333 Hz. An inevitable result is high frequency saturation on bright material. By decreasing the bias in accordance with the high frequency content of the material to be recorded, a higher level of high frequencies can be accommodated. For example, a reduction of bias to level 'd' permits the recording to 10 kHz signals 4 dB higher. This change in bias is accompanied by a loss in low and middle frequency sensitivity of about 0.5 dB and an increase in 10 kHz sensitivity of about 3 dB; preferably, the gain and equalization in the recording amplifier should be modified accordingly. For most tape formulations the change in tape sensitivity at low and middle frequencies is small, while the change in high frequency response is much larger. Thus, it may be sufficient to provide variable equalization to compensate for increased high frequency response. Since with no value of bias can the maximum output level at 10 kHz ever reach the maximum output level at 333 Hz obtained with the quiescent bias 'c', bright material will still give rise to saturation. The variable bias can only reduce the duration and amount of saturation.

Figure 12:
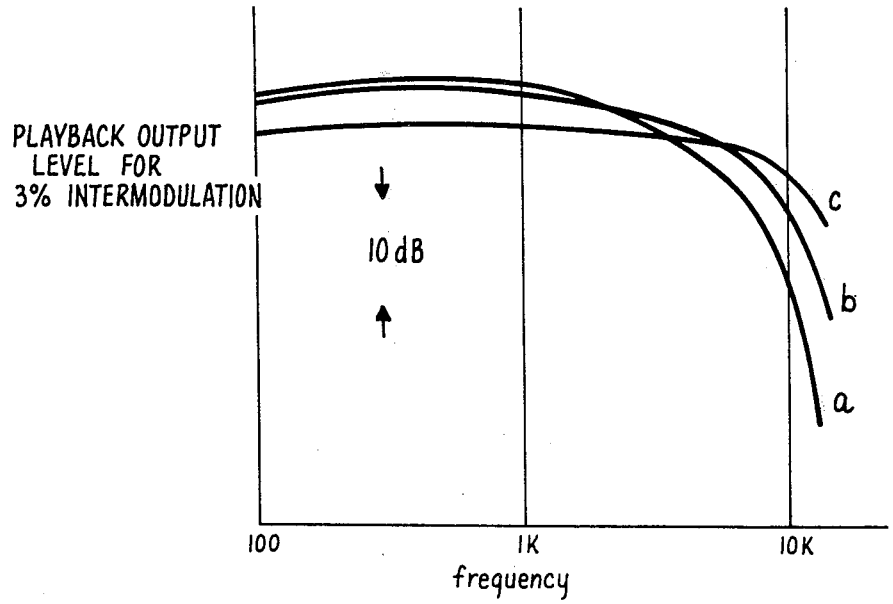
FIG. 12 is a set of exemplary curves relating playback output level to frequency response at a fixed distortion level for several choices of bias amplitude.

Measurement of twin-tone intermodulation distortion similarly reveals the benefit of varying the recording bias. FIG. 12 illustrates the level which can be recorded on Compact Cassette tape for a fixed proportion (3%) of third order intermodulation distortion, as a function of frequency and with three different values of recording bias. Curve a represents the typical performance when a fixed compromise value of bias is employed (as in conventional recorders). When the input signal contains large amplitudes at high frequencies, the recording bias may be reduced to permit recording with much lower distortion (see curves b and c).

Figure 6:
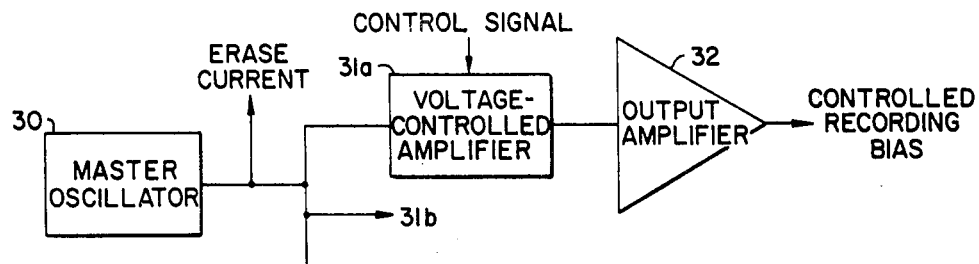
FIG. 6 is a block diagram showing one means of independent control of recording bias in multi-track recorders.

As explained above, in general a recorder capable of recording on more than one track at a time will require independent control of the recording bias for each track. The recording bias generator, block 3 in FIG. 1, may then take the form shown in FIG. 6. A master oscillator 30, for example, that which generates the high frequency power applied to the erase head to wipe the tape clean of any previous recording, is fed to a number of voltage-controlled amplifiers 31 $a$, $b$, $c$, one for each track. A plurality of control information generators like those shown in FIGS. 2 and 3, one for each track, operate on the appropriate voltage-controlled amplifier 31 to produce a variable amplitude signal, which passes to an output amplifier 32, one for each track. The output of amplifier 32 is the variable bias current applied to the recording head as indicated in FIG. 1.

Figure 9A:
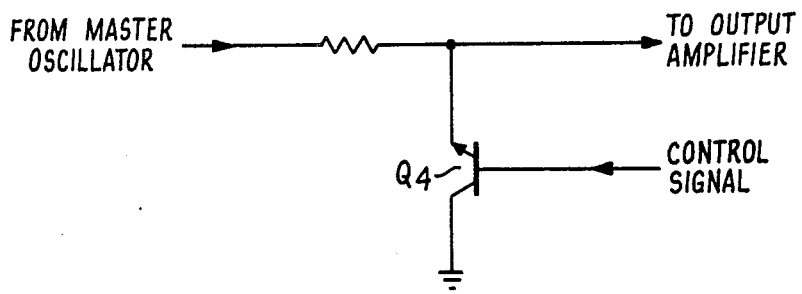
FIG. 9a is a schematic diagram showing a variable attenuator using a bipolar transistor.
Figure 9B:
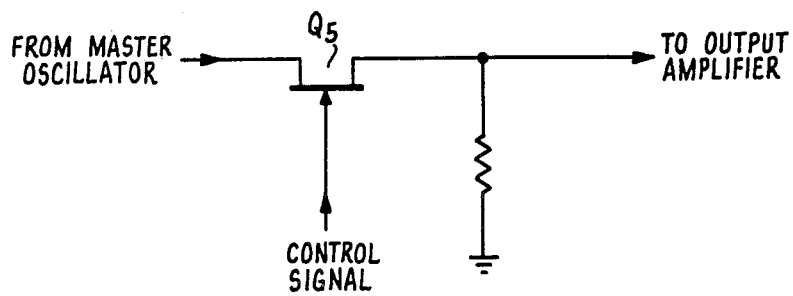
FIG. 9b is a schematic diagram showing a variable attenuator using a field effect transistor.
Figure 10:
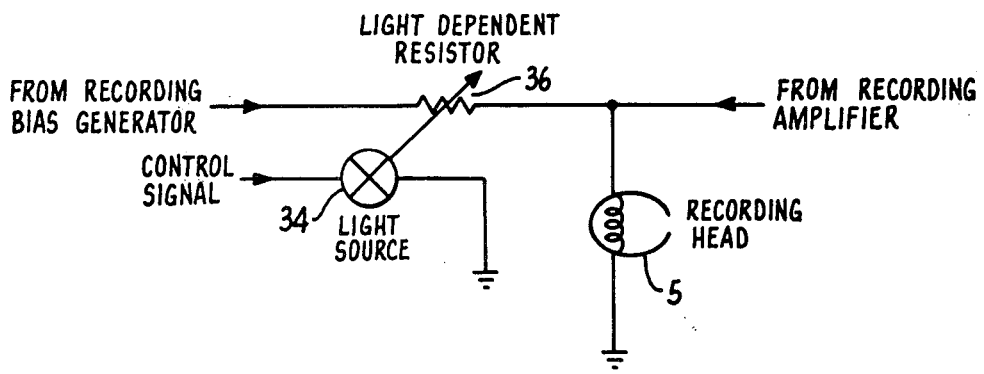
FIG. 10 is a schematic diagram showing a variable attenuator using a light dependent resistor.

The voltage controlled amplifiers 31 may alternatively be replaced by variable attenuators employing voltage-controlled resistances. If the circuit configuration is arranged so that the recording bias voltage is small (for example, a few tens of millivolts) at the point where its amplitude is controlled, bipolar or field-effect transistors (such as $Q_4$ or $Q_5$, respectively) may be employed as the variable elements. FIGS. 9$a$ and 9$b$ show examples. In other instances, particularly when the bias voltage to be controlled is large (for example, several volts), a light-dependent resistor, such as the devices fabricated of cadmium sulfide or cadmium selenide, may be employed to vary the bias amplitude; the control voltage is then employed to alter the brightness of a light source 34, either incandescent or more probably semi-conductor, shining on the light-dependent resistor. In some embodiments the bias output amplifier 32 can be eliminated, and the recording bias applied directly to the recording head via a light-dependent resistor 36, as in FIG. 10.

In all these cases the bias-varying mechanism can be employed additionally to turn on and off the bias smoothly at the beginning and end of recording, and to pre-select different values of quiescent bias current to suit different tape speeds or types.

Figure 7:
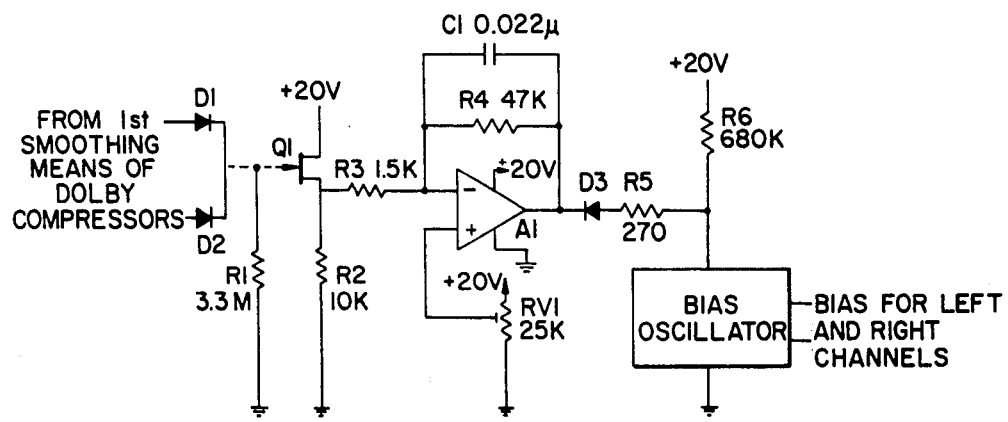
FIG. 7 is a partially block schematic diagram showing a circuit usable for providing variable bias in an audio recorder.

In embodiments where it is acceptable to control the bias amplitude of several record tracks together, a much simpler technique is to vary the power supply to the bias oscillator. FIG. 7 shows one practical circuit operating in this manner, for use in a stereo recorder containing Dolby B-Type noise reduction. Diodes D1 and D2 feed the greater of the outputs of the first smoothing means of the left and right channel Dolby compressors to the gate of field-effect transistor Q1 operating as a source follower and level shifter. The signal from the source of Q1 is applied to the input of operational amplifier A1 having an inverting gain of approximately 30 times at zero frequency and incorporating further smoothing by means of the parallel combination of resistors R4 and capacitor C1 in its feedback path; the time-constant of these components is about 1 ms, appreciably shorter than the fastest attack time of a Dolby B-Type compressor. The non-inverting input of amplifier A1 is connected to a potential set by potential divider RV1. The amplifier output is connected via diode D3 and resistor R5 in series to the power supply input connection of the bias oscillator, which draws its power through resistor R6. Under quiescent conditions the output potential of the amplifier is sufficiently positive that diode D3 is reverse-biased and the supply to the bias oscillator is determined by the value of resistor R6. As signal levels and frequencies at the input of the recorder are increased, the gate and therefore the source of Q1 move positively, and hence the output of amplifier A1 moves negatively. The threshold control RV1 is set so that at the approach of tape saturation at high frequencies, diode D3 becomes forward-biased, allowing amplifier A1 to draw current away from the oscillator via resistor R5, reducing the supply potential to the oscillator, and hence reducing the recording bias. As signal levels are progressively increased, the output of A1 falls more and draws more current away from the oscillator, progressively reducing the recording bias. Eventually, the output of A1 cannot go any further negative, and a minimum value of bias is reached.

Figure 11:
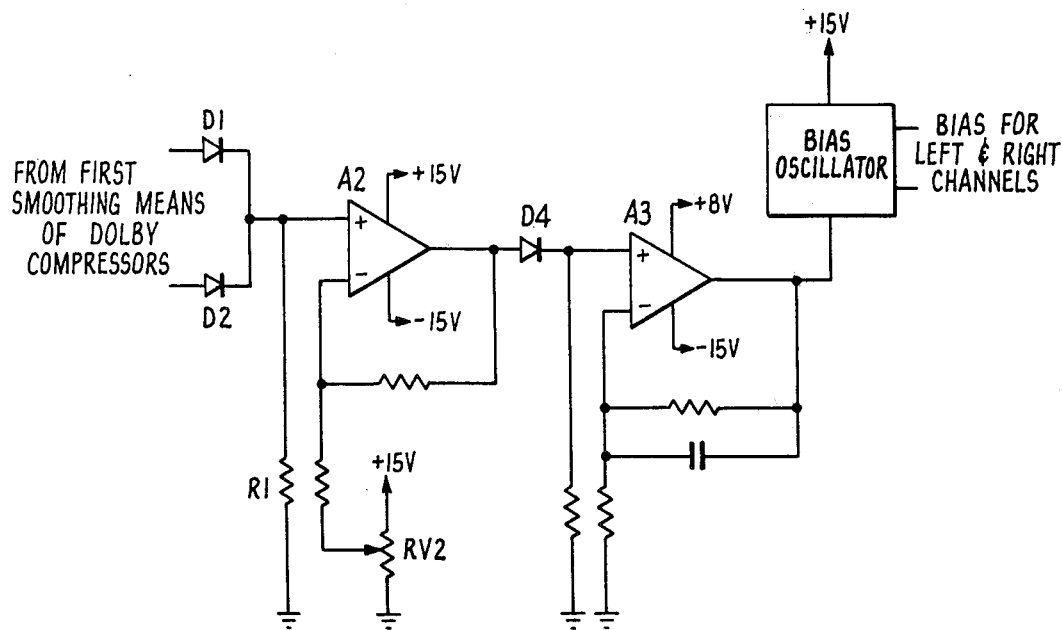
FIG. 11 is a partially block schematic diagram showing an alternative to FIG. 7.

An alternative circuit is shown in FIG. 11. As in FIG. 7, diodes D1 and D2 select the greater of the outputs of the first smoothing means of the left and right channel Dolby compressors. Amplifier A2 amplifies this signal and shifts its level by a voltage determined by the setting of thresholds control RV2. When the output of amplifier A2 becomes positive, it is passed via diode D4 to amplifier A4 which provides a further smoothing means and additional amplification. The power supply voltage for the bias oscillator is the difference between the main power supply (in this example, 15 volts) and the potential at the output of amplifier A3. Hence as the signals from the Dolby compressors move positively, the supply applied to the bias oscillator is reduced, and so the recording bias amplitude decreases. When the output potential of amplifier A3 approaches its positive power supply (in this example, 8 volts), the amplifier saturates, so providing a limit to the degree of reduction of bias amplitude.

The method of varying recording bias by changing the power applied to the bias oscillator may also be employed when the bias variation for each channel is required to be independent of other channels. In this case separate circuits, for example of the form shown in FIG. 7 or 11, are employed for each channel. The bias oscillators will normally be lightly coupled together, so that they operate at the same frequency.

Figure 8:
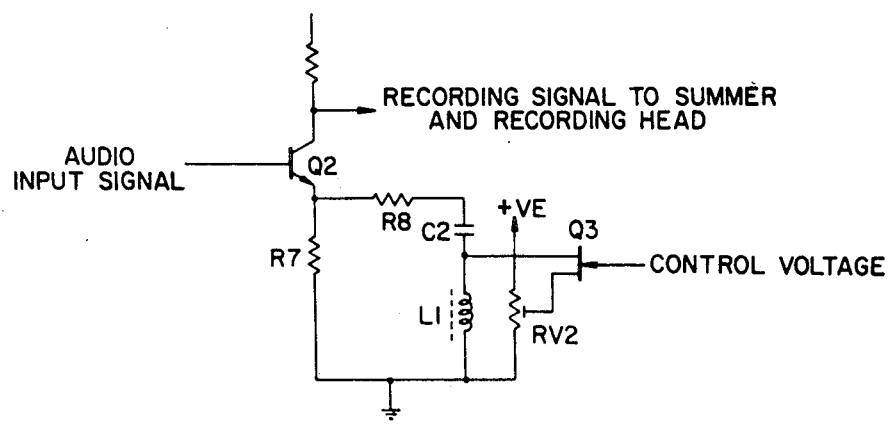
FIG. 8 is a schematic diagram showing a circuit usable for providing variable equalization in an audio recorder.

FIG. 8 shows one method of varying the recording equalization. Transistor Q2 is the recording amplifier with frequency-dependent feedback in its emitter circuit. The damping of the series resonant tuned circuit provided by R8 C2 L1 is varied by the resistance of the field-effect transistor Q3 in such a way that as the recording bias and equalization control voltage applied to the FET gate is made more positive, the damping is progressively increased, and the quantity of the treble boost applied to the signal passing to the recording head is thereby decreased.

As mentioned above and in connection with the discussion of FIG. 5, in Compact Cassette recording systems using dynamic bias reduction at high frequencies, variable equalization may be desirable so that the frequency response recorded on the tape remains flat.

Figure 13:
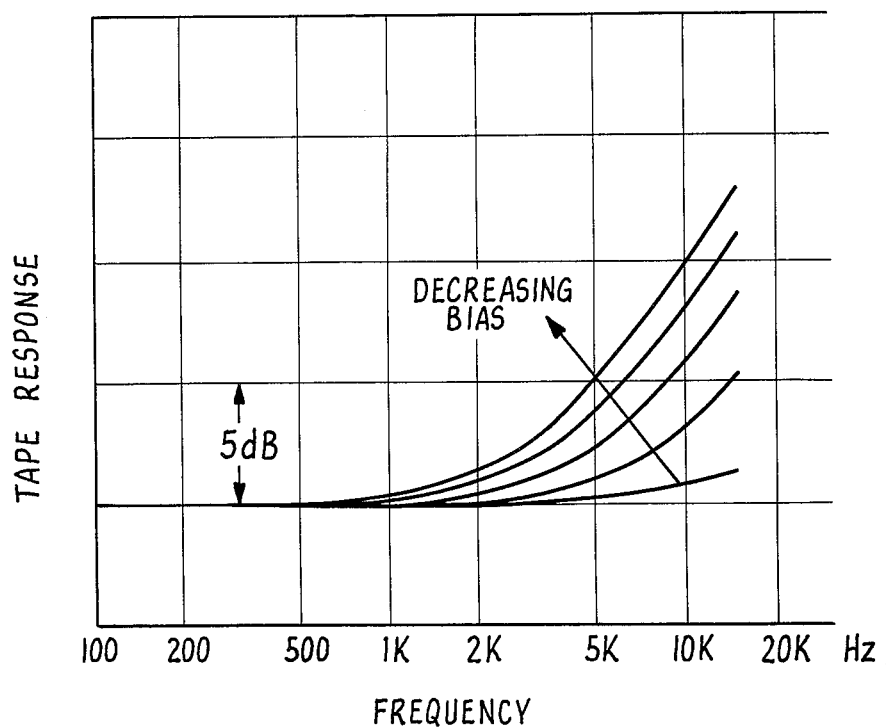
FIG. 13 shows a series of curves of tape sensitivity versus frequency indicating generally the family of 6 dB/octave lines resulting from various values of decreasing bias.

FIG. 13 shows a family of frequency response curves for a typical tape formulation in a Compact Cassette system for several different values of recording bias. The sensitivity of the tape at high frequencies rises as the recording bias is reduced from its quiescent value. Extensive testing of various tape types in their linear operating regions shows surprisingly that the change in high frequency response is a family of substantially 6 dB/octave curves having different turnover points depending on bias value. In view of this recognition, it then is possible to compensate for the change in tape sensitivity in a fairly simple and straightforward way. Until the tape saturates, therefore, variable equalization is preferably provided to cause a high frequency cut with a response curve matching the increase in sensitivity. Such a matching response curve is achieved within a reasonably close approximation by a single pole low pass filter which has a 6 dB/octave response. The transfer function for such a filter is $$\frac{1}{1 + j\omega T_c},$$

where $T_c$ is related to the amount of bias lowering. For each value of bias there is a particular filter time constant, $T_c$; hence, $T_c$ must vary with the bias.

At least for most tape formulations in Compact Cassette systems, and possibly in other cases, the relationship between $T_c$ and the dynamic bias value is linear:

$$T_c = k_1 - k_2 \alpha$$

where $$\alpha = \frac{I \text{ actual}}{I \text{ quiescent}}$$

Figure 14:
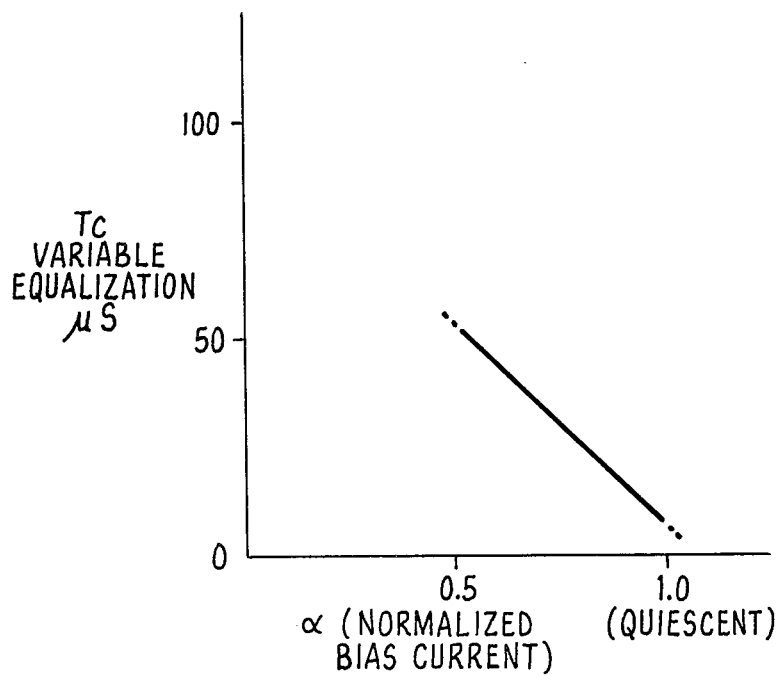
FIG. 14 is a plot of the variable equalization time constant versus normalized bias current.

(I is bias current). Suitable values for $k_1$ and $k_2$ have been found to be 106 and 100, respectively. However, these constants are to some extent dependent upon the tape formulation. These average values have been found to give results within about 2 dB on most tapes. FIG. 14 shows a plot of $T_c$ versus bias current (normalized).

Circuits providing variable equalization as the bias is varied can take various forms. A single pole low pass filter suitable for equalization at one particular reduced bias value, for example, can take the form of a series resistance and a shunt capacitance or a series inductance and a shunt resistance. In order to provide variable equalization, one or both of the elements must vary in response to a control signal.

Figure 15:
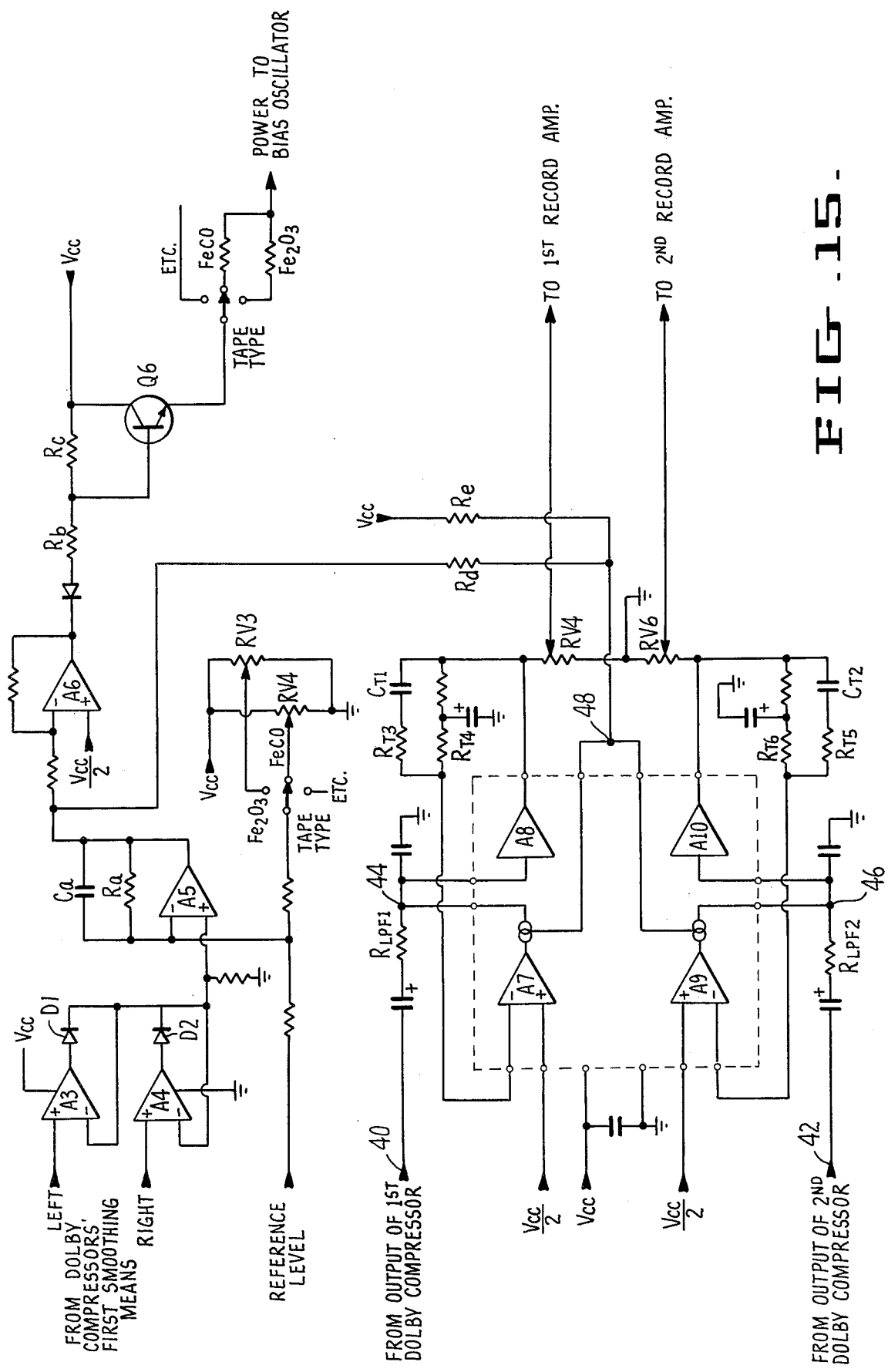
FIG. 15 is a schematic diagram of a portion of an audio recording system embodying the invention.

One suitable circuit for providing variable bias and equalization in accordance with these relationships is shown in FIG. 15. Portions of this circuit are similar to the circuit of FIG. 7. The circuit of FIG. 15 utilizes the output of the first smoothing means 21 of a Dolby B-type compressor (see FIG. 3) to derive a control signal which controls the bias level and equalization.

The recording bias and equalization are to vary in accordance with the high frequency content of the signal, thus the control circuitry must measure the high frequency amplitude, usually by means of a high frequency weighting filter and a rectifier. The level at which high frequency tape saturation occurs falls at approximately 12 dB/octave (at least over the critical 8 to 12 kHz region), so the weighting filter should rise at about this rate. Since a Dolby B-type processor contains filtering with this 12 dB/octave slope, and a rectifier, the signal within the Dolby processor can be used for economy.

As in some of the previous embodiments, common bias control of both channels is provided. Practical tests show that the psycho-acoustic effect of masking prevents any audible ill-effect. If desired, independent control of bias for each channel can be provided. Variable equalizer sub-circuits are provided in each channel. As explained further below, the variable equalizers are tantamount to single pole low pass filters having a series resistance and variable shunt capacitance.

Signals from the first smoothing means of Dolby B-type compressors are applied to input buffer amplifiers A3 and A4 which isolate the Dolby compressor circuitry and act in connection with diodes D1 and D2 to provide an output to amplifier A5 that is the greater of the two Dolby compressor signals. Amplifier A5 is a high gain DC non-inverting amplifier and further provides smoothing as a result of resistor $R_a$ and capacitor $C_a$. This amplifier stage has a time constant of about 200 μs, less than 1 ms attack time of the Dolby processor first smoothing means. This further smoothing is desirable to avoid abrupt changes in bias and equalization that may produce audible distortion on certain noise-like signals. The potentiometers RV3 ad RV4 select the threshold values of control voltage at which bias reduction begins. Each tape formulation requires a different threshold. The output of A5 feeds two sub-circuits: one for bias control and one for equalization control.

The bias control sub-circuit includes a unity gain inverting amplifier A6, referenced to one-half the supply voltage $V_{cc}$, the output of which controls the base potential of NPN transistor Q6 which is in series with the power supply to the bias oscillator.

Figure 16:
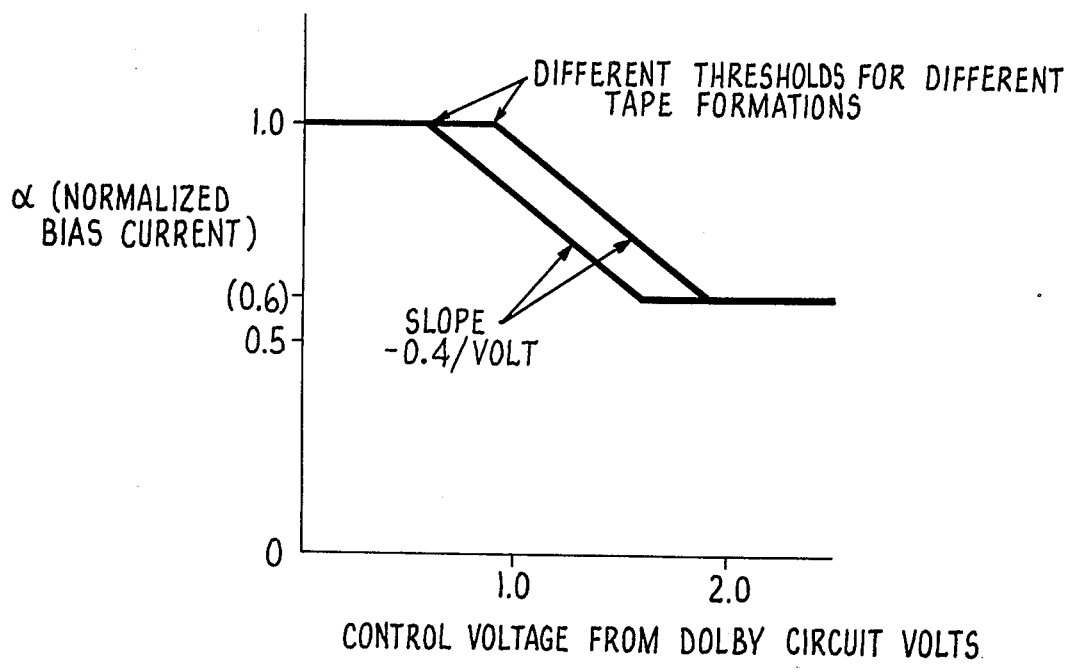
FIG. 16 is a plot of normalized bias current versus Dolby compressor circuit control voltage.

FIG. 16 shows a plot of normalized bias current for several tape formulations versus control voltage from the Dolby processor. As the Dolby processor voltage increases and reaches the selected threshold for that tape formulation, A5 and A6 begin to provide an output that drives Q6 toward cutoff. The ratio of $R_b$ and $R_c$ at the base of Q6 determines the ratio of minimum to quiescent bias. The quiescent bias level is set by the portion of the tape type switch that selects a resistor value in series between Q6 and the bias oscillator power input. Thus, for each tape formulation switch position, a threshold level and a quiescent level are chosen. The slope ($-0.4$/volt in the example) is determined by the gain of devices, A5, A6 and Q6.

The variable equalizer sub-circuit employs a dual variable transconductance amplifier and has a variable cut-off time-constant $T_c$ which is a linear function of the current through resistor $R_d$. The values of resistors $R_d$ and $R_e$ are related to $V_{cc}$ to obtain a control current independent of $V_{cc}$, in accordance with the constants of the above equation relating $T_c$ to normalized bias current.

As the control voltage at the output of A5 rises, the bias current falls, the current through $R_d$ rises and $T_c$ rises, lowering the filters' turnover frequency to compensate for the increased tape sensitivity shown generally in FIG. 13.

The heart of the variable equalizer sub-circuit is a conventional dual variable - transconductance amplifier available commercially in a single integrated circuit and sold as the National LM13600. A similar device is sold as the RCA 3280. The arrangement of this integrated circuit as a controllable low pass filter is not indicated in the circuit manufacturers' application notes.

Processed audio outputs from a Dolby B-type compressor in each audio channel (left and right) are applied to the equalizer inputs 40 and 42 and through blocking capacitors to resistors $R_{LPF1}$ and $R_{LPF2}$, which form, respectively, the series resistance portions of two variable low pass filters. Between points 44, 46 and ground the integrated circuit and associated components effectively form variable capacitors controlled by the current at point 48.

Figure 17:
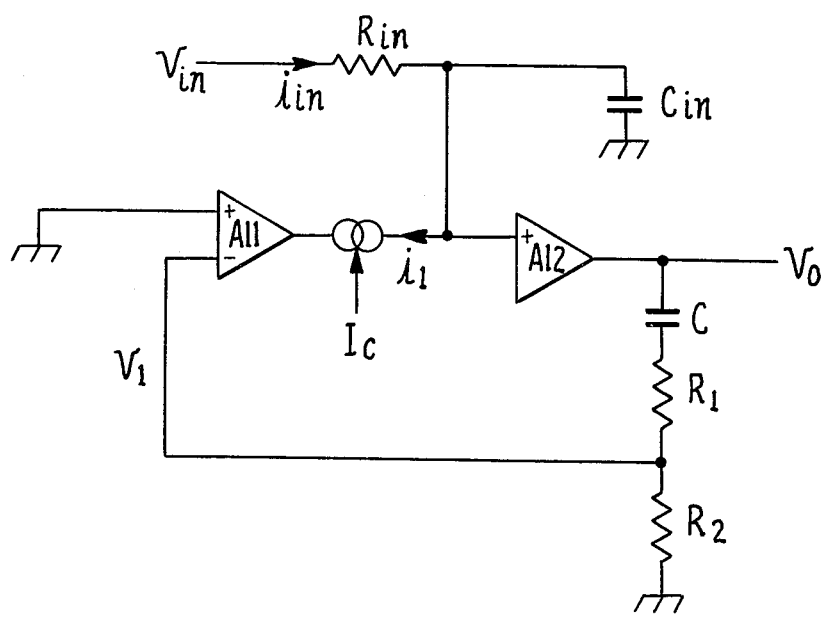
FIG. 17 is a simplified schematic diagram of the variable low pass filter employed in the circuit of FIG. 15.

FIG. 17 shows a simplified diagram of the variable low pass filter for purposes of functional analysis and explanation as to the circuit operation. Amplifier A11 (which corresponds to A7 and A9 in FIG. 15) is a variable transconductance amplifier. Amplifier A12 (corresponding to A8 and A10) is a non-inverting unitary gain buffer amplifier. $R_{in}$ corresonds to $R_{LPF1}$ and $R_{LPF2}$ of FIG. 15. $R_1$, $R_2$ and C determine a fixed time constant. C corresponds to $C_{T1}$ and $C_{T2}$ in FIG. 15. $R_1$ and $R_2$ correspond to resistor pairs $R_{T3}$-$R_{T4}$ and $R_{T5}$-$R_{T6}$ respectively, which act as voltage dividers to alter current to A7 and A9.

It can be shown that the circuit of FIG. 17 behaves as a series resistor $R_{in}$ and a shunt variable capacitor $C_c$, where:

$$C_c = \frac{T_c}{R_{in}} = \left( \frac{R_1 + R_2}{R_{in}} \cdot C + C_{in} \right) + g_m R_2 C$$

$$g_m = kI_c \text{ (at room temperature, } k = 19.2v^{-1})$$

hence the equation for $C_c$ is in the form:

$$C_c = a + bI_c$$

and the effective shunt capacitance $C_c$ has a straight line relationship to control current $I_c$. The whole circuit behaves as a variable low pass filter having a transfer function of the form $$\frac{1}{1 + j\omega T_c}$$

whose cut-off time-constant $T_c$ is a linear function of control current $I_c$.

More specifically,

Equation 1
$$g_m = \frac{i_1}{v_1} = kI_c$$

Equation 2
$$v_1 = \frac{R_2}{R_1 + R_2 + v_1/j\omega C} \cdot v_o = v_o \cdot \frac{R_2}{R_1 + R_2} \cdot \frac{j\omega(R_1 + R_2)C}{1 + j\omega(R_1 + R_2)C}$$

Equation 3
$$i_{in} = i_1 + j\omega C_{in} v_o$$

Equation 4
$$v_{in} = i_{in}R_{in} + v_o$$

From 1, Equation 5
$$i_1 = g_m v_1$$

From 5 and 3, Equation 6
$$i_{in} = g_m v_1 + j\omega C_{in} v_o$$

From 6 and 2, Equation 7
$$i_{in} = v_o \left[ \frac{g_m R_2}{R_1 + R_2} \cdot \frac{j\omega T}{1 + j\omega T} + j\omega C_{in} \right] \text{ where } T = (R_1 + R_2)C$$

$$= v_o \left[ g'_m \cdot \frac{j\omega T}{1 + j\omega T} + j\omega C_{in} \right] \text{ where } g'_m = g_m \cdot \frac{R_2}{R_1 + R_2}$$

$$= v_o \left[ \frac{j\omega(g'_m T + C_{in}) - \omega^2 C_{in} T}{1 + j\omega T} \right]$$

From 7 and 4, Equation 8
$$v_{in} = v_o \left[ \frac{j\omega(g'_m R_{in} T + R_{in} C_{in}) - \omega^2 R_{in} C_{in} T}{1 + j\omega T} + 1 \right]$$

$$= v_o \left\{ \frac{1 + j\omega[(1 + g'_m R_{in})T + R_{in} C_{in}] - \omega^2 R_{in} C_{in} T}{1 + j\omega T} \right\}$$

if at all frequencies of interest, $\omega T \ll 1$, $\omega R_{in} C_{in} \ll 1$, this can be written $$v_{in} \simeq v_o \{1 + j\omega[(1 + g'_m R_{in})T + R_{in} C_{in}]\} \quad 9$$

Hence from 9
$$\frac{v_o}{v_{in}} \simeq \frac{1}{1 + j\omega T_c} \text{ where } T_c = (1 + g'_m R_{in})T + R_{in} C_{in} \quad 10$$

or in full
$$T_c = \left(1 + g_m \cdot \frac{R_2}{R_1 + R_2} \cdot R_{in}\right)(R_1 + R_2)C + R_{in} C_{in} \quad 11$$

$$= (R_1 + R_2 + g_m R_2 R_{in})C + R_{in} C_{in}$$

$$= R_{in}\left[\left(\frac{R_1 + R_2}{R_{in}}C + C_{in}\right) + g_m R_2 C\right]$$

In terms of the FIG. 15 circuit, the time constant $T_c$ is controlled by the control current at point 48 that varies the transconductance of amplifiers A7 and A9. The equalizer outputs from amplifiers A8 and A10 are taken through variable resistors RV4 and RV6 for application to record amplifiers for each channel. The variable resistors permit setting the record calibration levels.

Those of ordinary skill in the art will appreciate that various modifications within the spirit of the invention can be made to the preferred embodiments disclosed. The invention is therefore to be limited only by the scope of the appended claims.

I claim:

1. Apparatus for recording audio signals on a magnetic medium in which the sensitivity of the medium varies in a frequency dependent manner as the amplitude of the record bias signal is varied, comprising
   amplifier means receiving said audio signals,
   means responsive to said audio signals for generating a record bias signal varying in amplitude in response to at least one predetermined parameter of said audio signals,
   means for varying the equalization of said amplifier means as said record bias signal varies, said means for varying the equalization having a frequency dependent response to compensate for said variation in sensitivity, and
   means in recording relationship with said magnetic medium for applying the amplified audio signals and said varying record bias signal to said magnetic medium.

2. The combination of claim 1 further comprising means for varying the gain of said amplifier means as said record bias signal varies to further compensate for said variation in sensitivity.

3. The combination of claim 2 wherein said at least one predetermined parameter is the amplitude of said audio signals in a predetermined frequency spectrum.

4. The combination of claim 3 wherein said means for generating a record bias signal generates a record bias signal having a quiescent amplitude when said audio signals have less than a predetermined amplitude in a predetermined frequency spectrum and generates a record bias signal varying from said quiescent amplitude when said input signal has greater than said predetermined amplitude in said predetermined frequency spectrum.

5. The combination of claim 3 or 4 wherein said predetermined frequency spectrum is substantially that portion of the audio signal frequency spectrum that would tend to cause the magnetic medium to saturate when the record bias is at said quiescent value.

6. The combination of claim 1 wherein said at least one predetermined parameter is the amplitude of said audio signals in a predetermined frequency spectrum.

7. The combination of claim 6 wherein said means for generating a record bias signal generates a record bias signal having a quiescent amplitude when said audio signals have less than a predetermined amplitude in a predetermined frequency spectrum and generates a record bias signal varying from said quiescent amplitude when said input signal has greater than said predetermined amplitude in said predetermined frequency spectrum.

8. The combination of claim 10 or 7 wherein said predetermined frequency spectrum is substantially that portion of the audio signal frequency spectrum that would tend to cause the magnetic medium to saturate when the record bias is at said quiescent value.

9. The combination of claims 1 or 6 wherein the apparatus is for recording at least two channels of audio signals on said magnetic medium, each of said channels having amplifier means and means in recording relationship with said medium, said system having a single means for generating a varying bias signal and a single means for varying the equalization, whereby the same varying bias signal and compensating varying equalization is employed in each channel.

10. The combination of claim 1 wherein the high frequency sensitivity of said medium increases as the amplitude of the record bias signal is reduced, said means for varying the equalization including a variable low pass filter.

11. The combination of claims 10 or 8 wherein the cut-off frequency of said low pass filter is linearly related to the amplitude of said bias signal.

12. The combination of claims 10 wherein said low pass filter is a single pole low pass filter.

13. The combination of claims 1, 10 or 12 wherein the high frequency sensitivity of said medium increases at the rate of 6 dB/octave for changes in the amplitude of said record bias signal and wherein said equalization means has a substantially complementary 6 dB/octave response.

14. In a system for recording audio signals on a magnetic medium comprising
compressor means receiving said audio signals for outputting compressed audio signals, said means including means for generating a control signal responsive to the high frequency components of said audio signals to controllably reduce the gain of said compressor means,
means further responsive to said control signal for generating a record bias signal varying in response to said control signal to reduce the amplitude of said record bias signal, and
means in recording relationship with said magnetic medium for applying the audio signals and said varying record bias signal to said magnetic medium.

15. The combination of claim 14 wherein said compressor means comprises a Dolby B-Type compressor.

16. The combination of claim 14 wherein said high frequency compressor means has a variable frequency response responsive to the high frequency components of said audio signals, whereby said control signal is responsive to components of said audio signals in a variable high frequency band.

17. The combination of claims 14, 15 or 16 further comprising means for varying the equalization of said audio signals as said record bias signal varies.

18. The combination of claim 17 wherein the high frequency sensitivity of said medium increases at the rate of 6 dB/octave for changes in the amplitude of said record bias signal and wherein said equalization means has a substantially complementary 6 dB/octave response.

19. The combination of claim 17 wherein said system is for recording audio signals on a magnetic medium in which the sensitivity of the medium varies in a frequency dependent manner as the amplitude of the record bias signal varies, said means for varying the equalization having a frequency dependent response to compensate for said variation in sensitivity.

20. The combination of claim 19 wherein the system is for recording at least two channels of audio signals on said magnetic medium, each of said channels having compressor means and means in recording relationship with said magnetic medium, said system having a single means for generating a varying record bias signal and a single means for varying the equalization, whereby the same varying bias signal and compensating varying equalization is employed in each channel.

21. The combination of claim 19 wherein the high frequency sensitivity of said medium increases at the rate of 6 dB/octave for changes in the amplitude of said record bias signal and wherein said equalization means has a substantially complementary 6 dB/octave response.

22. The combination of claim 19 wherein the high frequency sensitivity of said medium increases as the amplitude of the record bias signal is reduced, said means for varying the equalization including a variable low pass filter.

23. The combination of claim 22 wherein the high frequency sensitivity of said medium increases at the rate of 6 dB/octave for changes in the amplitude of said record bias signal and wherein said equalization means has a substantially complementary 6 dB/octave response.

24. The combination of claims 22 wherein said low pass filter is a single pole low pass filter.

25. The combination of claim 22 wherein the reciprocal of the cut-off frequency of said low pass filter is linearly related to the amplitude of said bias signal.

26. The combination of claim 24 wherein the reciprocal of the cut-off frequency of said low pass filter is linearly related to the amplitude of said bias signal.

27. The combination of claim 19 wherein said system is for recording audio signals on a magnetic medium in which the sensitivity of the medium varies as the amplitude of the record bias signal is varied, said system further comprising means for varying the gain of said amplifier means as said record bias signal varies to compensate for said variation in sensitivity.

28. The combination of claim 14 wherein said system is for recording audio signals on a magnetic medium in which the sensitivity of the medium varies in a frequency dependent manner as the amplitude of the record bias signal varies, said system further comprising means for varying the gain and equalization of said amplifier means as said record bias signal varies to compensate for said variation in sensitivity.

* * * * *

UNITED STATES PATENT AND TRADEMARK OFFICE
CERTIFICATE OF CORRECTION

PATENT NO. : 4,263,624
DATED : Apr. 21, 1981
INVENTOR(S) : Kenneth J. Gundry

It is certified that error appears in the above-identified patent and that said Letters Patent are hereby corrected as shown below:

Column 3, line 1, "examplary" should be --exemplary--.

Column 11, Equation 2, "v" should be omitted before "1/jwC".

Column 11, Equation 11, line 43, after the last plus sign, "$R_{in}C_{in}$" should be raised up from line 45 and inserted there.

Claim 11, line 1, after "the" (second occurrence) --reciprocal of the-- should be inserted.

Signed and Sealed this

Twenty-eighth Day of July 1981

[SEAL]

Attest:

Attesting Officer

GERALD J. MOSSINGHOFF

Commissioner of Patents and Trademarks